United States Patent
Cormier, Jr.

(10) Patent No.: US 7,443,331 B2
(45) Date of Patent: Oct. 28, 2008

(54) MULTIPLE-BANK CMOS IMAGE SENSOR SYSTEM AND METHOD

(75) Inventor: Ronald F. Cormier, Jr., Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 94 days.

(21) Appl. No.: 11/507,799

(22) Filed: Aug. 22, 2006

(65) Prior Publication Data

US 2008/0048901 A1   Feb. 28, 2008

(51) Int. Cl.
*H03M 1/12* (2006.01)
(52) U.S. Cl. .................. 341/155; 341/158
(58) Field of Classification Search .......... 341/155, 341/156, 158; 348/308; 250/208.1, 214 A
See application file for complete search history.

(56) References Cited

U.S. PATENT DOCUMENTS 5,202,687 A * 4/1993 Distinti ............ 341/158
2005/0078780 A1 * 4/2005 Chou et al. ........ 375/350

\* cited by examiner

*Primary Examiner*—Rexford Barnie
*Assistant Examiner*—Joseph Lauture
(74) *Attorney, Agent, or Firm*—Alan K. Stewart; W. James Brady; Frederick J. Telecky, Jr.

(57) ABSTRACT

A CMOS image sensor system includes first and second groups of CMOS sensors each responsive to periodic first and second clock signal edges, the second clock signal edge being out-of-phase with the first clock signal edge. Output signals of the first group of CMOS sensors are coupled to a first group of sampling capacitors, respectively, by a first group of sampling switches. Then output signals of the second group of CMOS sensors are coupled to a second group of sampling capacitors, respectively, by means of a second group of sampling switches. Sampled signals on the second group of sampling capacitors to an input of an ADC, and then sampled signals on the first group of sampling capacitors are coupled to the input of the ADC by means of by multiplexing and sample/hold circuitry. A phase of at least one of the first and second clock signal edges is adjusted in response to calibration information so as to avoid circuit noise from being superimposed on sampled signals coupled to the input of the ADC.

20 Claims, 12 Drawing Sheets

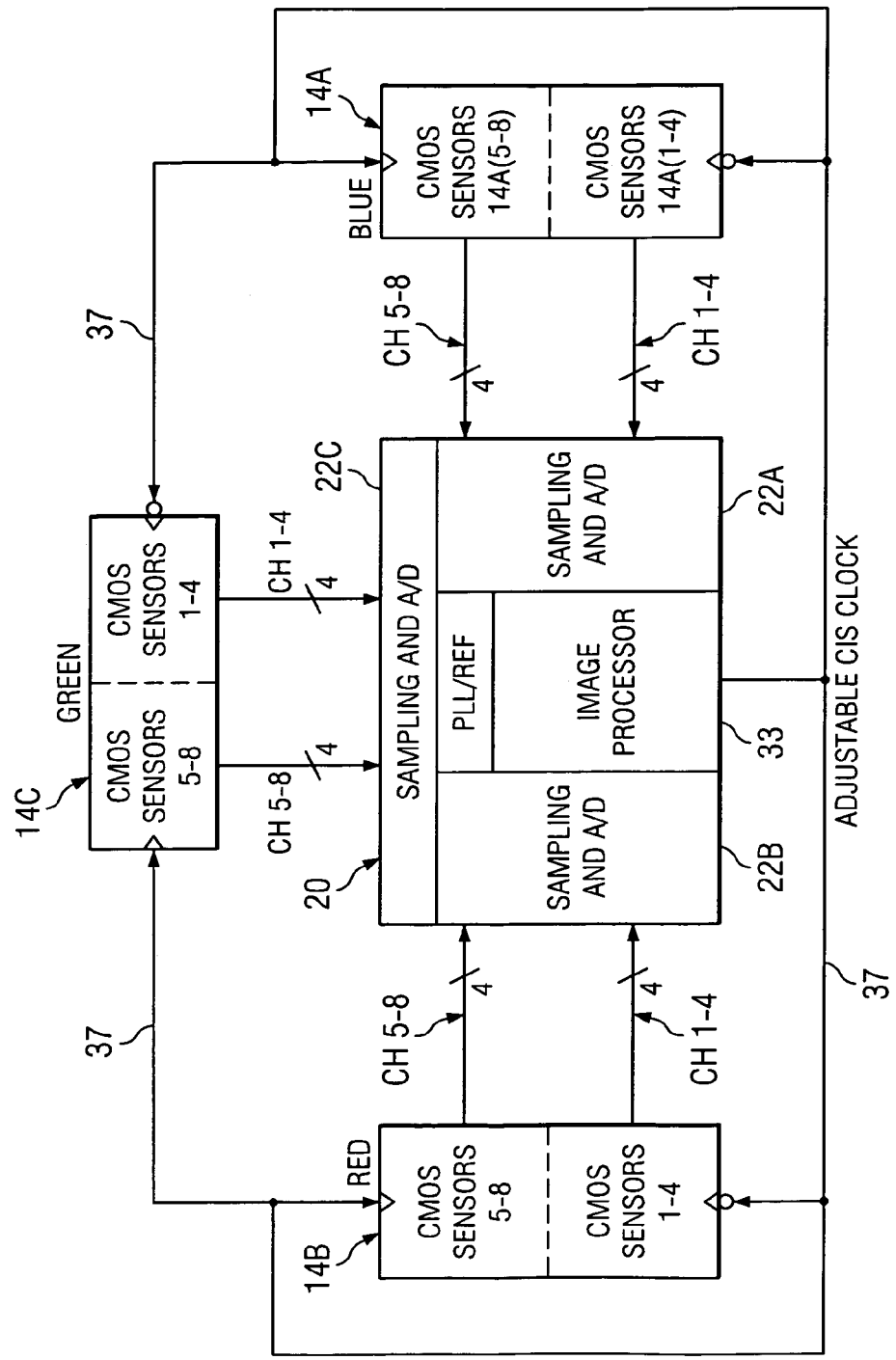

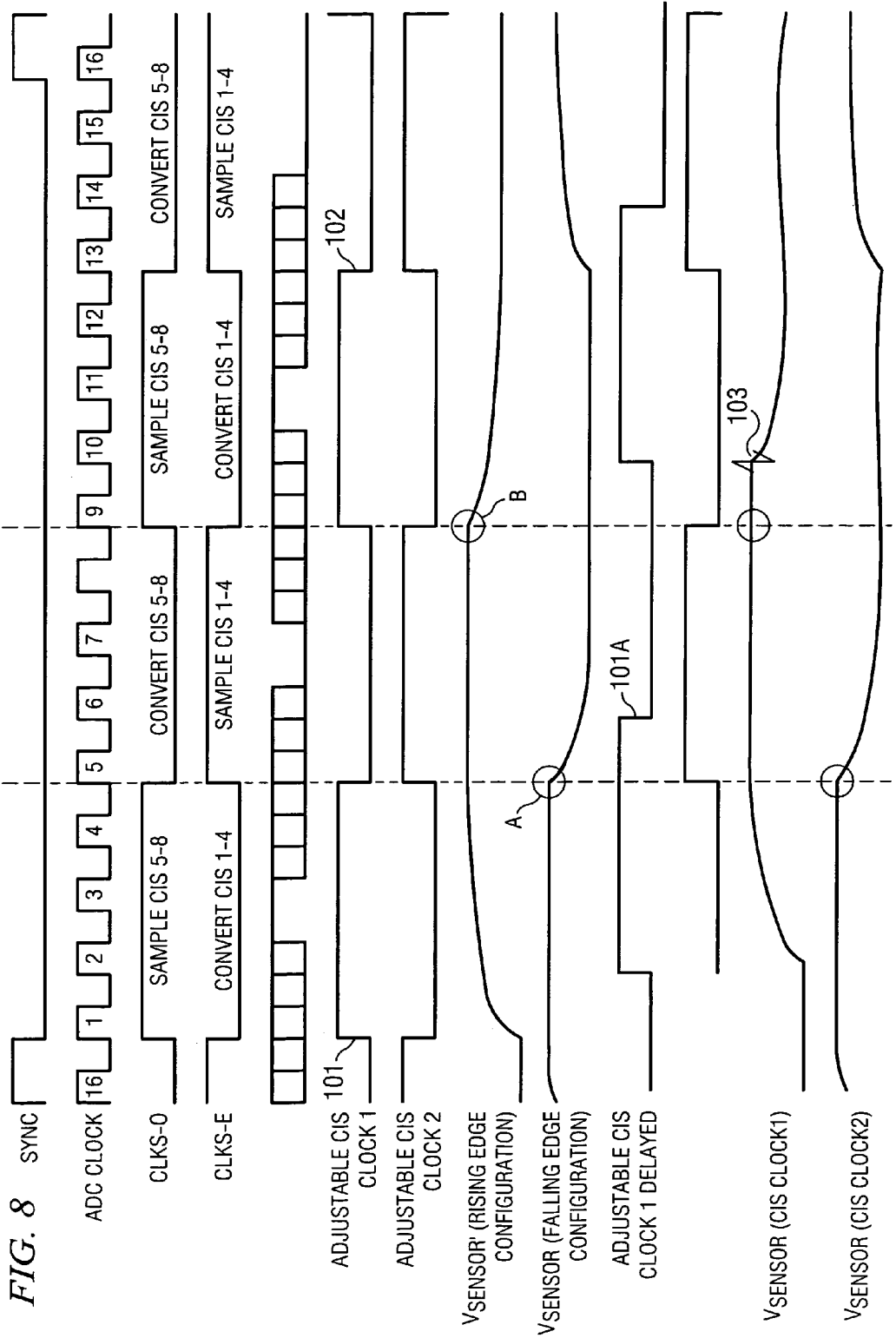

MULTIPLE-BANK CMOS IMAGE SENSOR SYSTEM AND METHOD

BACKGROUND OF THE INVENTION

The present invention relates generally to a system and method for adjustment of clock signals in multi-input CMOS image sensor processor systems (also referred to as "CIS image systems" or "CIS image processor systems"), and more particularly to an architecture which provides an integrated circuit including multiple parallel CIS (CMOS image sensor) modules that require only a single analog to digital converter (ADC), in order to increase system imaging speed, reduce power consumption, and avoid analog-to-digital conversion inaccuracies due to externally generated noise.

The CMOS image sensor samples the photons of the incoming light, and its resulting charge is converted to a voltage which subsequently is coupled to a the input of a corresponding sample/hold amplifier, which has an associated settling time. A typical CMOS image sensor (also referred to simply as a "CMOS sensor") operates to accumulate photons and generate corresponding charge representative of the light intensity during the present time interval, and at the same time charge previously generated (during the previous time interval) is being stored and presented as an output voltage to be sampled. The sampled voltage ordinarily is steered and amplified to provide an analog output signal which typically is converted to a digital output signal. Some CMOS sensors have the capability of having their output signals enabled or strobed in, response to rising edges of an enable or strobe signal. Other CMOS sensors have the capability of having their output signals enabled or strobed in response to falling edges of the enable or strobe signal, and yet other CMOS sensors are programmable to provide either capability. CMOS sensors have associated output signal settling times during which sampling capacitors are being charged by the CMOS sensors.

FIGS. 1A-1C are believed to be indicative of the closest prior art, which includes multiple CIS signal sampling and conversion circuits arranged to receive analog inputs from corresponding CMOS sensors and convert them to corresponding digital output signals. Such systems are commonly used in various applications, for example in copy machines that include multiple CIS channels clocked by an external clock generating system. The external clock generating system routes a single clock signal into different CIS sampling and conversion circuits. For example, multiple CMOS sensors and associated lens systems are commonly used on a moving sensor light bar of a copier for scanning a face of a document. In some cases, there is a second sensor light bar for essentially simultaneously scanning the other face of the document. In the past, the CMOS sensors of such systems have been operated in a serial fashion, wherein serial sampling and analog-to-digital conversion of a CMOS sensor output voltage are performed using corresponding dedicated sampling circuitry and a dedicated ADC for each CMOS sensor. The settling of the sample/hold circuits in the prior art have been problematic.

CMOS sensors usually have two outputs. One is the signal level SIG, and the other is a reset output RST. The reset output RST functions as the reference voltage level for the CMOS sensor. In FIG. 1A, CIS image processing system 1 includes first and second "banks" of CMOS sensors. The first bank includes 4 CMOS sensors 14A(1-4) which produce output signals SIG1-4 and reset signals RST1-4. The signals SIG1-4 are selectively switched by switching circuit 18A into a first sample/hold circuit 43-1, and the signals RST1-4 are selectively switched by switching circuit 18B into first sample/hold circuit 43-1. Similarly, the second bank includes 4 CMOS sensors 14A(5-8) which produce output signals SIG5-8 and reset signals RST5-8. The signals SIG5-8 are selectively switched by switching circuit 18C into a second sample/hold circuit 43-2, and the signals RST5-8 are selectively switched by switching circuit 18D into second sample/hold circuit 43-2. The outputs of sample/hold circuits 43-1 and 43-2 are connected to inputs of first and second ADCs (analog to digital converters) 45-1 and 45-2, respectively. Control circuit 47 receives a clock signal ADC CLOCK and a control signal CONTROL BIT, for the purpose of controlling the way ADC CLOCK is directed to sample/hold circuits 43-1,2 and to ADCs 45-1,2.

For example, depending on the state of CONTROL BIT, sample/hold circuits 43-1 and 43-2 can sample the CMOS sensors 1-4 and 5-8 in phase or out of phase with each other, and accordingly, ADCs 45-1 and 45-2 can operate either in phase or out of phase with each other. In either case, the amount of time available for sampling of the CMOS sensor outputs is one-half of the cycle time of ADC CLOCK.

Referring to FIG. 1B, the waveforms of the signal sample clock SIG SAMPLE CLOCK, and the reset sample clock RST SAMPLE CLOCK, the main signal SIG, and the reset signal RST of a CMOS sensor are shown. The voltage level of RST is sampled every RST SAMPLE CLOCK pulse 2 and the voltage level of SIG is sampled every SIG SAMPLE CLOCK pulse 3, typically to accomplish correlated double sampling. A single sampling capacitor (e.g., see capacitors C1-8 in FIG. 1C) samples the voltage level of RST pulse 2 during a first half cycle of ADC CLOCK, and the sensor output signal SIG then is sampled on the next half-cycle of ADC CLOCK. The feature "A" in the SIG waveform illustrates a perturbation that occurs when the sampling capacitor has some residual charge remaining from the previous conversion. Only one half of a clock cycle of ADC CLOCK is available for the perturbation "A" to settle out. That amount of settling time is indicated by arrows 5 between the perturbation "A" and the sampling time indicated by vertical dashed line 4. That condition requires that the output buffer or amplifier (not shown) of the CMOS sensor settle rapidly. That in turn may cause analog to digital conversion inaccuracies. (In some cases, costly, power-consuming external buffers/amplifiers need to be connected to the outputs of CMOS sensors in order to achieve more rapid settling.)

FIG. 1C illustrates an implementation in which outputs of 8 CMOS sensors are switched into 8 corresponding sampling capacitors C1-8, all in response to the same sampling signal CLKS which are shown in the timing diagram of FIG. 1D. Each sampling pulse of CLKS has a relatively short duration, equal to that of ADC CLOCK, for a duration equal to one half of the ADC CLOCK cycle. (In the prior art, there also are similar image processing systems that have two different sampling phases, for example, to sample 4 CMOS sensors during one phase and 4 other CMOS sensors during the next phase. The prior art systems referred to have utilized two ADCs, as shown in FIG. 1A. However, these systems also have the shortcoming that each CLKS clock pulse has the same relatively short duration equal to half of the ADC CLOCK cycle time.)

A problem of the prior art systems is that there cost is higher than desirable because more than one costly sample/hold circuits and ADCs are required. Also, the prior art results in less accuracy of the digital output signals than is desired because externally generated circuit board noise is coupled to and superimposed on the analog input signals received by the inputs of the ADCs, which results in analog to digital conversion inaccuracies due to the fact that sampling timing is fixed. Furthermore, if more than one A/D or S/H is used, then the gain circuitry and DAC circuitry of each channel has a net mismatch associated with it relative to the other channels consisting of both systematic and random effects not limited to gain mismatch and offset mismatch.

In the past, attempts have been made to operate the sample/hold amplifier at the same speed as the ADC coupled to the output of the sample/hold amplifier. However, this approach has been problematic because high speed operation usually requires correspondingly large amounts of power consumption, and also because it has typically been necessary to use costly external amplifier/buffers.

An externally generated clock signal applied as an input to an integrated circuit frequently is susceptible to outside noise influences that require clock signals be low pass filtered to reduce square wave harmonics. Once the "rounded" low-pass-filtered clock signal reaches the CIS integrated circuit chip, the clock signal must be "squared" again for use within the digital image processing portion of the CIS integrated circuit chip. This introduces delays and clock timing errors that interfere with the timing of the CIS relative to the ADCs within the multi-input CIS image processor integrated circuit chip. Also, the time of occurrence of a rising edge of the CIS clock signal within the multi-input CIS image processor integrated circuit chip may be substantially different than the time of occurrence of the falling edge thereof. With inflexible timing, inaccurate analog to digital conversion often occurs, which limits the performance of the entire imaging system.

Thus, there is an unmet need for an improved system and method for providing multi-input CIS image processing integrated circuits that provide substantially increased imaging speed by, in effect, allowing parallel sampling of multiple CMOS image sensors and which also provide substantially reduced power consumption by allowing analog output signals produced by multiple CMOS image sensors to be coupled to the same input of a single ADC.

There also is an unmet need for an improved system and method for providing multi-input CIS image processing integrated circuits which avoid the difficulties of inaccurate analog to digital conversion due to coupling of noise present in a printed circuit board to the input of an ADC.

SUMMARY OF THE INVENTION

It is an object of the invention to provide an improved system and method for providing multi-input CIS image processing integrated circuits that provide substantially increased imaging speed by, in effect, allowing parallel sampling of multiple CMOS image sensors and which also provide substantially reduced power consumption by allowing analog output signals produced by multiple CMOS image sensors to be coupled to the same input of a single ADC.

It is another object of the invention to provide an improved system and method for providing multi-input CIS image processing integrated circuits which avoid the difficulties of inaccurate analog to digital conversion due to coupling of noise on a printed circuit board to the input of an ADC.

It is another object of the invention to provide an improved system and method for providing multi-input CIS image processing integrated circuits which require less integrated circuit chip area than the prior art and which therefore reduce cost.

It is another object of the invention to provide an improved system and method for providing multi-input CIS image processing integrated circuits which provide better matching of the gains of the various CMOS sensor channels than the prior art.

It is another object of the invention to provide an improved system and method for providing multi-input CIS image processing integrated circuits which increase the amount of time available to sample the CMOS image sensors.

It is another object of the invention to provide an improved system and method for providing multi-input CIS image processing integrated circuits having an improved way of achieving self-calibration of a multi-CIS imaging system.

Briefly described, and in accordance with one embodiment, the present invention provides A CMOS image sensor system includes first and second groups of CMOS sensors (14A(1-8)) each responsive to periodic first and second clock signal edges, the second clock signal edge being out-of-phase with the first clock signal edge. Output signals (17-1,2,3,4) of the first group of CMOS sensors are coupled to a first group of sampling capacitors (C1-4), respectively, by a first group of sampling switches (S1-4). Then output signals (17-5,6,7,8) of the second group of CMOS sensors are coupled to a second group of sampling capacitors (C5-8), respectively, by means of a second group of sampling switches (S5-8). Sampled signals on the second group of sampling capacitors to an input of an ADC (45), and then sampled signals on the first group of sampling capacitors are coupled to the input of the ADC (45) by means of by multiplexing and sample/hold circuitry. In one embodiment, a phase of at least one of the first and second clock signal edges is adjusted in response to calibration information so as to avoid circuit noise from being superimposed on sampled signals coupled to the input of the ADC.

In one embodiment, a CMOS image sensor system includes a first group of CMOS sensors (14A(1-4)) each responsive to a periodic first clock signal edge to present an output signal representative of sampled light intensity, and a second group of CMOS sensors (14A(5-8)) each responsive to a periodic second clock signal edge to present an output signal representative of sampled light intensity, the second clock signal edge being out-of-phase with respect to the first clock signal edge. A first group of sampling switches (S1-4) couples output terminals (17-1,2,3,4) of the first group of CMOS sensors (14A(1-4)) to a first group of sampling capacitors (C1-4), respectively, and a second group of sampling switches (S5-8) couples output terminals (17-5,6,7,8) of the second group of CMOS sensors (14A(5-8)) to a second group of sampling capacitors (C5-8), respectively. A sample/hold circuit (43) has an output coupled to an input of an ADC (analog-to-digital converter) (45), and a switching circuit (42) includes an output coupled to an input of the sample/hold circuit (43), and also includes a first group of inputs (18-1,2, 3,4) coupled to the sampling switches (S1-4) of the first group, respectively, and a second group of inputs (18-5,6,7,8) coupled to the sampling switches (S5-8) of the second group, respectively. The switching circuit (42) sequentially couples sampled signals on the first group of sampling capacitors (C1-4) to the input of the sample/hold circuit (43) between the first and second clock signal edges and sequentially couples sampled signals on the second group of sampling capacitors (C5-8) to the input of the sample/hold circuit 43) after the second clock signal edge.

In one embodiment, the first clock signal edge is a rising edge of a first clock signal (ADJUSTABLE CIS CLOCK) and the second clock signal edge is a falling edge of the first clock sign al (ADJUSTABLE CIS CLOCK), and a phase of the rising edge of the first clock signal (ADJUSTABLE CIS CLOCK) is adjustable relative to an ADC clock signal (ADC CLOCK) independently of a phase of the falling edge of the first clock signal, and wherein the phase of the falling edge of the first clock signal (ADJUSTABLE CIS CLOCK) is adjustable relative to the ADC clock signal (ADC CLOCK) independently of the phase of the rising edge of the first clock signal. In another embodiment, the first clock signal edge is a rising edge of a first clock signal (ADJUSTABLE CIS CLOCK1) and the second clock signal edge is a rising edge of a second clock signal (ADJUSTABLE CIS CLOCK2) which is out of phase with the first clock signal.

In the described embodiments, the CMOS image sensor system includes clock adjustment circuitry (36) which includes a first register (66A) for storing rising edge adjustment information, and which also includes a finite state machine (67) coupled to the first register (66A) and operative to adjust a phase of the first clock signal edge, relative to a signal (ADC CLOCK) which clocks the ADC (45), in accordance with the rising edge adjustment information, and also includes a second register (66B) coupled to the finite state machine (67) for storing falling edge adjustment information, wherein the finite state machine (67) is operative to adjust a phase of the second clock signal edge, relative to the signal which clocks the ADC (45), in accordance with the falling edge adjustment information. The first clock edge signal and/or the second clock edge signal is shifted relative to the signal which clocks the ADC so as to prevent circuit noise from being superimposed on sampled signals being converted by the ADC.

In one embodiment, the invention provides a method of operating a CMOS image sensor system that includes a first group of CMOS sensors (14A(1-4)) each responsive to a periodic first clock signal edge to present an output signal representative of sampled light intensity, including providing a second group of CMOS sensors (14A(5-8)) each responsive to a periodic second clock signal edge to present an output signal representative of sampled light intensity, the second clock signal edge being out-of-phase with respect to the first clock signal edge, and coupling output terminals (17-1,2,3,4) of the first group of CMOS sensors (14A(1-4)) to a first group of sampling capacitors (C1-4), respectively, by means of a first group of sampling switches (S1-4). Output terminals (17-5,6,7,8) of the second group of CMOS sensors (14A(5-8)) are coupled to a second group of sampling capacitors (C5-8), respectively, by means of a second group of sampling switches (S5-8). Sampled signals on the second group of sampling capacitors (C5-8) are sequentially coupled to an input of an ADC (45) during the coupling to the first group of sampling capacitors, and sampled signals on the first group of sampling capacitors (C1-4) are coupled to the input of the ADC (45) during the coupling to the second group of sampling capacitors. In one embodiment, the method includes adjusting a phase of at least one of the first and second clock signal edges, relative to a signal which clocks the ADC (45), in accordance with stored calibration information so as to avoid circuit noise from being superimposed on sampled signals coupled to the input of the ADC (45).

In one embodiment, the invention provides a CMOS image sensor system including a first group of CMOS sensors (14A(1-4)) each responsive to a periodic first clock signal edge to present an output signal representative of sampled light intensity, a second group of CMOS sensors (14A(5-8)) each responsive to a periodic second clock signal edge to present an output signal representative of sampled light intensity, means (36) for producing the second clock signal edge in out-of-phase relationship with respect to the first clock signal edge, means (S1-4,63) for coupling output terminals (17-1,2,3,4) of the first group of CMOS sensors (14A(1-4)) to a first group of sampling capacitors (C1-4), respectively, means (S5-8,63) for coupling output terminals (17-5,6,7,8) of the second group of CMOS sensors (14A(5-8)) to a second group of sampling capacitors (C5-8), respectively, means (42,43, 63) for sequentially coupling previously sampled signals on the second group of sampling capacitors (C5-8) to an input of an ADC (45) during the previous coupling to the first group of sampling capacitors, and means (42,43,63) for sequentially coupling previously sampled signals on the first group of sampling capacitors (C1-4) to the input of the ADC (45) during the previous coupling the second group of sampling capacitors. The CMOS image sensor system also includes means (66A/B,67,36) for adjusting a phase of at least one of the first and second clock signal edges, relative to a signal which clocks the ADC (45), in accordance with stored calibration information so as to avoid circuit noise from being superimposed on sampled signals coupled to the input of the ADC (45).

BRIEF DESCRIPTION OF THE DRAWINGS

FIG. 6 is a more detailed block diagram of an image sensing system including the multi-input CIS image processor integrated circuit of FIG. 3.

FIG. 8 shows a timing diagram similar to the one in FIG. 7 useful in describing the operation a version of the multi-input CIS image processor integrated circuit of FIG. 4A that has been modified to provide two out-of-phase adjustable CIS clock signals coupled to separate banks of CMOS sensors which are enabled or strobed only by rising edges of the two out-of-phase adjustable CIS clock signals.

DETAILED DESCRIPTION OF THE PREFERRED EMBODIMENTS

In the described embodiments of the invention, the analog output signals produced by the multiple banks of CMOS sensors are all sampled and then converted to digital equivalents within a relatively short single synchronization time frame. In order to achieve both reduced cost for the required ADCs and suitably high image processing speed, the CMOS sensors of a particular kind, e.g. blue light CMOS sensors, are arranged in banks which are alternately strobed or enabled so that the analog output signals of one bank are rapidly and sequentially coupled to the input of a single ADC while the CMOS sensors of another bank are accumulating photons and generating corresponding charge and output voltages representative of the intensity of the sensed light.

Figure 1A:
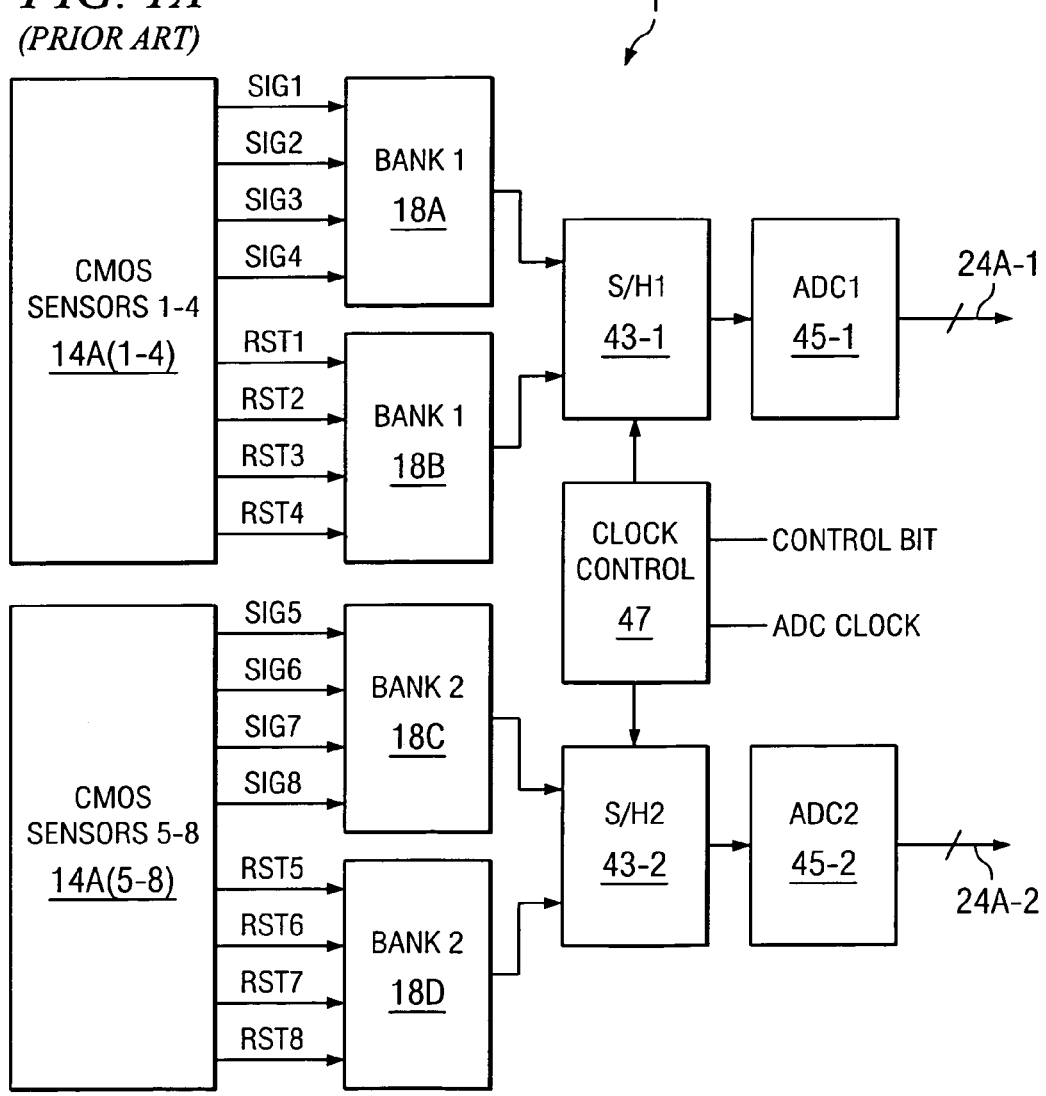
FIG. 1A is a block diagram of prior art multi-input CIS image processor system.
Figure 1B:
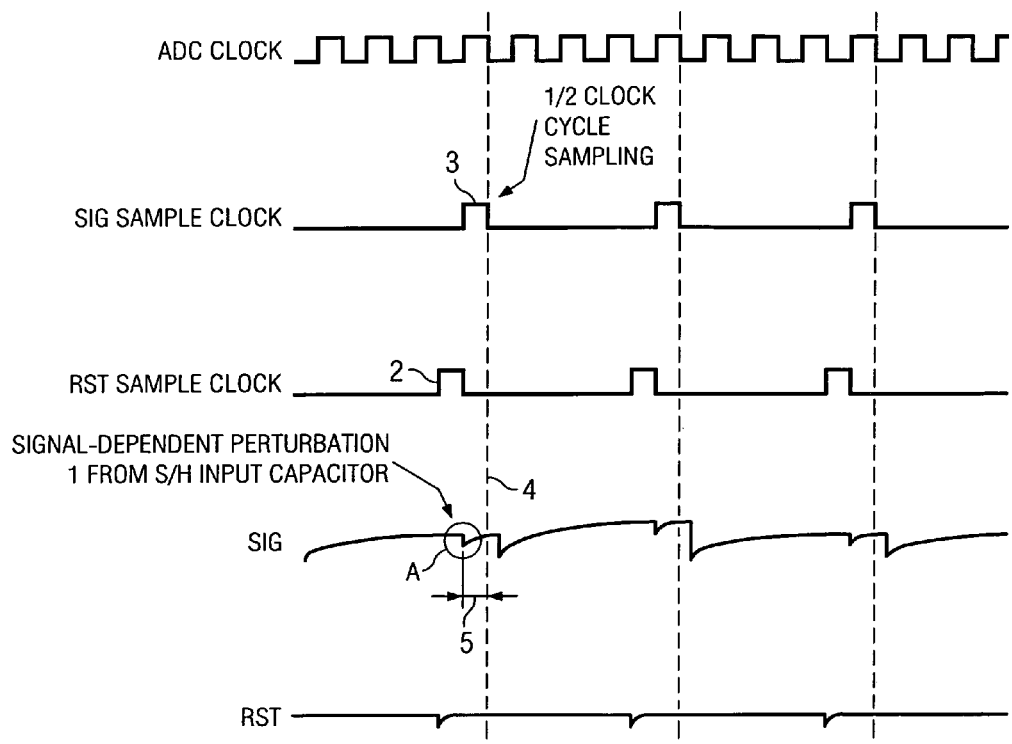
FIG. 1B is a timing diagram useful explaining the shortcomings of the prior art shown in FIG. 1A.
Figure 1C:
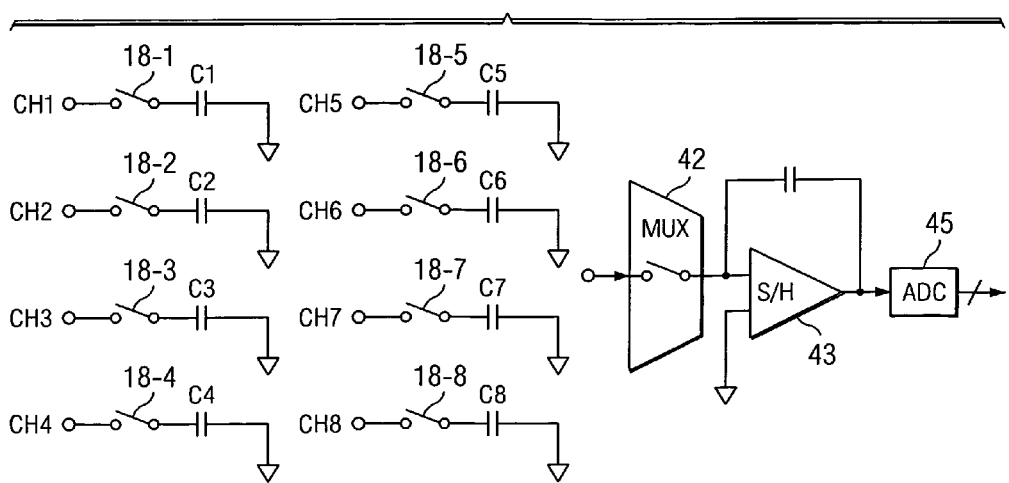
FIG. 1C is a schematic diagram illustrating CMOS sampling circuitry in FIG. 1A.
Figure 1D:
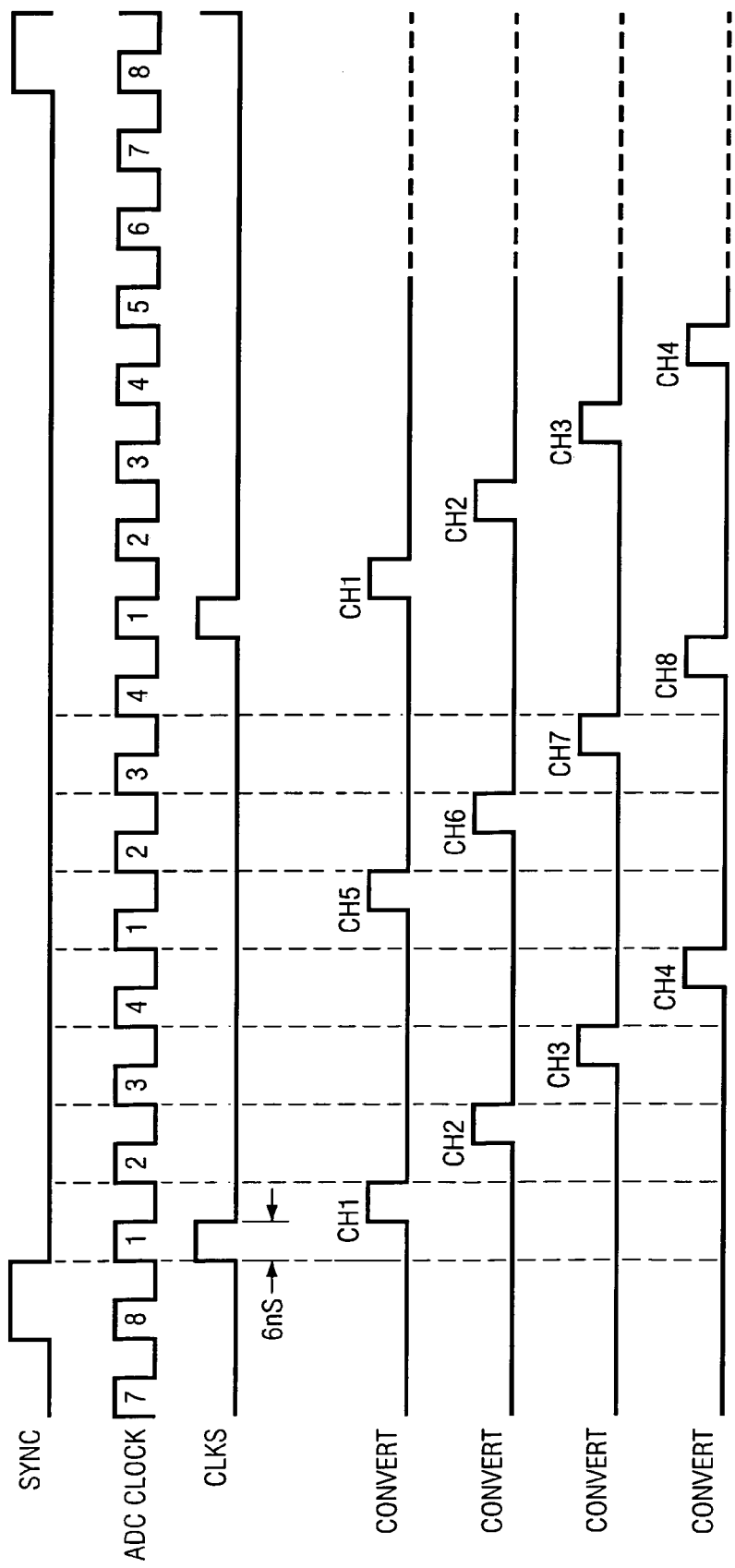
FIG. 1D is a timing diagram useful explaining the operation of FIG. 1C.
Figure 2:
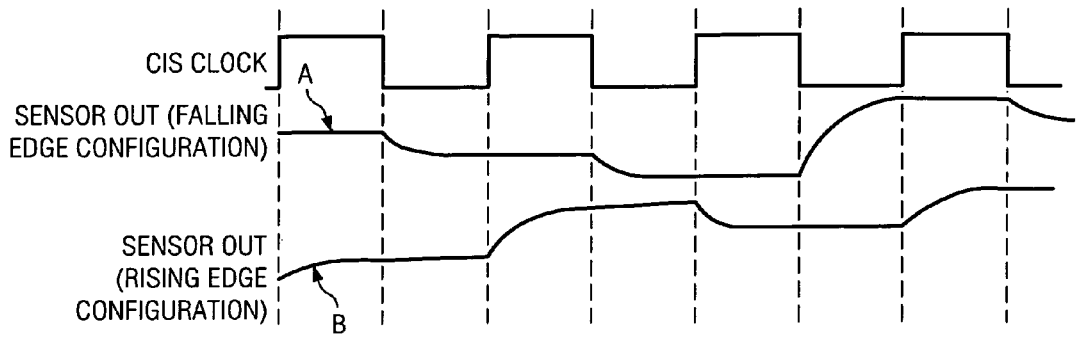
FIG. 2 is a timing diagram useful in describing prior art CMOS sensors.

FIG. 2 shows a waveform of a clock signal CIS CLOCK which can be used to enable or strobe either a conventional CMOS sensor which produces an analog output signal representative of the ambient light intensity in response to falling edges of its enable or strobe input, as indicated by waveform A, or to enable or strobe a conventional CMOS sensor which produces its analog output signal in response to the rising edges of its enable or strobe input, as indicated by waveform B.

Figure 3:
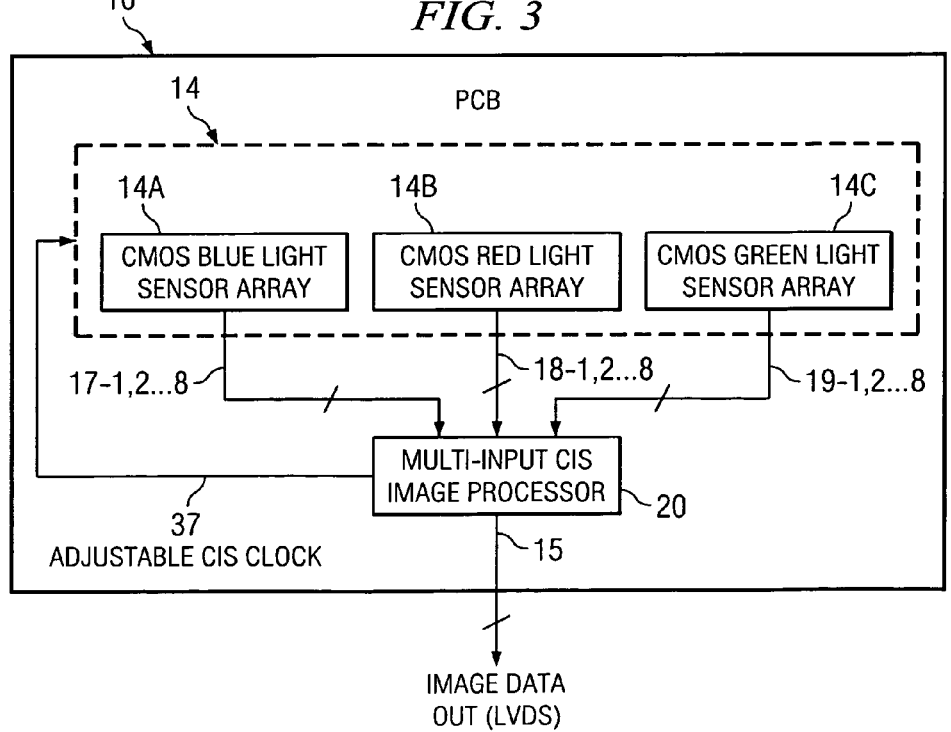
FIG. 3 is a block diagram of a system including a multi-input CIS image processor integrated circuit of the present invention.

FIG. 3 shows a block diagram of an image processing system including a blue, red, and green light-sensitive CMOS sensor array 14 and a multi-input CIS image processor 20 mounted on a printed circuit board (PCB) 10. CMOS sensor array 14 includes 8 blue light sensors 14A having their outputs connected to conductors 17-1,2 . . . 8, respectively, 8 red light sensors 14B having their outputs connected to conductors 18-1,2 . . . 8, respectively, and 8 green light sensors 14C having their outputs connected to conductors 19-1,2 . . . 8, respectively. In accordance with the present invention, multi-input CIS image processor 20 generates at least a signal ADJUSTABLE CIS CLOCK on a conductor 37. ADJUSTABLE CIS CLOCK controls enabling or strobing of the CMOS sensors in array 14, as subsequently explained. Only a single ADC is required in each of CMOS sensor arrays 14A, 14B and 14C. A LVDS (low voltage differential signal) ribbon cable 15 extends from the output of multi-input CIS image processor chip 20 to external microprocessor and support circuitry (not shown). The ADJUSTABLE CIS CLOCK signal on conductor 37 goes from the multi-input CIS image processor 20 chip to the arrays of blue, red, and green light CMOS sensors which, in effect, operate in parallel.

In a practical implementation, for example in a photocopier, 8 CMOS sensors which are sensitive to a particular color of incoming light are arranged in a strip which extends across part or all of a line of a page to be copied. In the example of FIG. 3, there are three such strips for each scan line, one strip including 8 CMOS sensors that detect blue light, an adjacent strip including 8 CMOS sensors that detect red light, and an adjacent strip including 8 CMOS sensors that detect green light.

In the described embodiments of present invention, groups or banks of CMOS sensors are arranged so the banks are alternately enabled or strobed in response to one or two out-of-phase edges of one CIS clock signal, or in response to corresponding edges of two out-of-phase CIS clock signals. The internal ADC clock signals are in fixed timing relationship relative to each other, but in either the one-CIS-clock case or the two-CIS-clock case, there is an internal clock signal that has 16 discrete time increments (which are associated with pulses of a 80 MHz clock) by means of which the timing of the enabling or strobing of the output signals produced by the CMOS sensors can be adjusted according to various criteria, including avoidance of noise that otherwise would be superimposed on a CMOS sensor output signal at the time it is converted to digital form by the ADC. The phases of the rising and falling edges of the CIS clock signals therefore can be controlled in small (e.g., 6 nanosecond) increments relative to the 80 MHz ADC clock. The phases of the edges of the CMOS sensor sampling clock signals can be adjusted independently in this fashion.

Figure 4A:
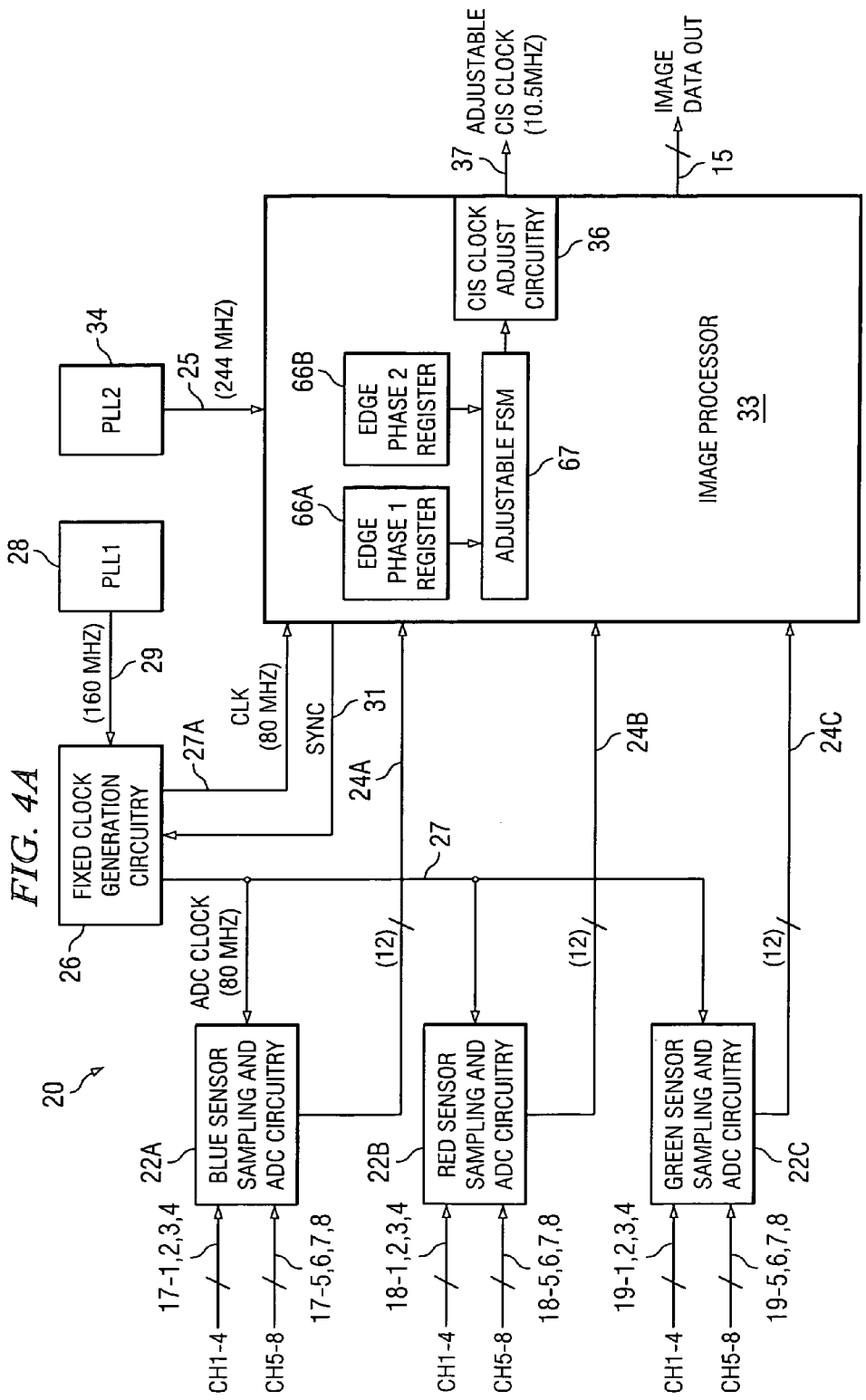
FIG. 4A is a block diagram of the multi-input CIS image processor integrated circuit in block 20 of FIG. 3.

FIG. 4A shows the basic architecture of multi-input CIS image processor 20 in FIG. 3, including generally conventional image processor circuitry 33. Image processor 33 modifies the raw data received from the A/D converters (in blocks 22A,B,C) in such a way as to allow for the ultimate viewing of the subject being copied, faxed, or viewed. In accordance with the present invention, image processor 33 also includes CIS clock adjustment circuitry 36, which generates the adjustable clock signal ADJUSTABLE CIS CLOCK on conductor 37. Multi-input CIS image processor 20 also includes blue light sensor sampling and ADC circuitry 22A, red light sensor sampling and ADC circuitry 22A, and green light sensor sampling and ADC circuitry 22A. (Of course, the invention applies equally to a black-and-white imaging system.)

An adjustable finite state machine 67 and edge phase registers 66A and 66B in which CIS clock edge calibration information is stored are shown in FIG. 4A, with the outputs of edge phase register 1 and edge phase register 2 designated by reference numerals 66A and 66B, respectively. This information allows CIS clock adjustment circuitry 36 to adjust the phase of the rising edge and falling edge of a single CIS clock signal or to adjust the phases, relative to ADC CLOCK, of either rising edges or falling edges of two CIS clock signals, in accordance with subsequently described FIGS. 8 and 9.

Blue light sensor sampling and ADC circuitry 22A in FIG. 4A receives 8 blue light CMOS sensor output signals CH1-8 from CMOS blue light sensor array 14A on conductors 17-1,2 . . . 8, respectively. Similarly, red light sensor sampling and ADC circuitry 22B receives 8 red light CMOS sensor output signals CH1-8 from CMOS red light sensor array 14B on conductors 18-1,2 . . . 8, and green light sensor sampling and ADC circuitry 22C receives 8 green light CMOS sensor output signals CH1-8 from CMOS green light sensor array 14C on conductors 19-1,2 . . . 8. Clock generation circuitry in block 26 receives, for example, a 160 MHz signal on conductor 29 from a phase locked loop circuit 28 and receives a signal SYNC from image processor 33, and generates, for example, an 80 MHz signal ADC CLOCK on conductor 27 which is connected to clock inputs of the sensor sampling and ADC circuitry in each of blocks 22A,B,C. "Fixed clock" generation circuitry 26 also generates an 80 MHz clock signal CLK on conductor 27A which is connected to an input of image processor 33. A master clock generating circuit 34 generates, for example, 240 megahertz clock signal on conductor 25, which is applied to an input of image processor 33 for the purpose of generating high speed LVDS and image processing clock signals. (It should be appreciated that image processor 33 operates in conjunction with two clock signal "domains" having an asynchronous interface between them, with the signal generated on conductor 25 by the phase locked loop circuit PLL1 being a master clock signal.)

The digital output signals produced by sensor sampling and ADC circuits 22A, 22B and 22C are applied to image processor 33 by multi-conductor buses 24A, 24B, and 24C, respectively. The ADCs in blocks 22A,B,C can be 12-bit ADCs. Image processor 33 produces the signal IMAGE DATA OUT on above mentioned LVDS digital bus 15, which is a high-speed serial type bus including 4 parallel channels by means of which the data typically is sent to a microcontroller which sends it to a file, printer, screen etc.

Image processor 33 controls when the SYNC signal pulses occur, which is once for every 16 CLK pulses, and utilizes the 80 MHz clock signal CLK on conductor 27A in order to facilitate various timing aspects of the operation of the three ADCs despite various signal delays which are always present in digital systems. The 80 MHz clock signal CLK is the image processor's master clock. However to synchronize the ADC to its needed timing, image processor 33 generates the SYNC signal every 16 CLK cycles. Moreover, only the image processor "knows" the timing of the CIS clock(s) and its relation to SYNC. The relationship of SYNC and ADJUSTABLE CIS CLOCK are controlled by calibration information in the CIS clock signal edge adjustment registers 66A and 66B, as subsequently explained. The signal CLK on conductor 27A is essentially the same as ADC CLOCK on conductor 27, but has digital signal voltage levels to make it more suitable for use in generating the digital signals utilized to adjust the times of occurrence of the rising edges and the falling edges of ADJUSTABLE CIS CLOCK.

Figure 4B:
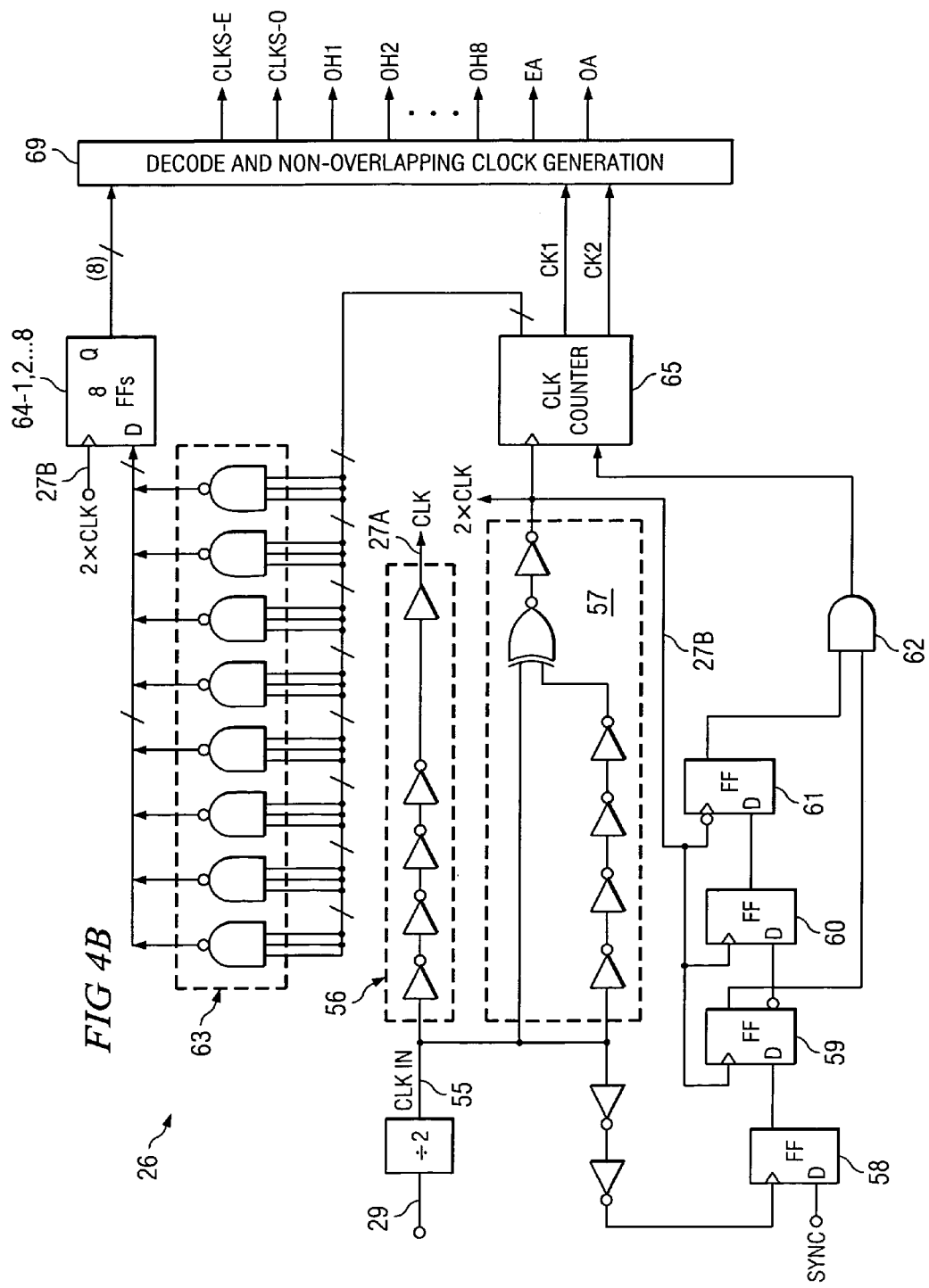
FIG. 4B is a diagram illustrating details of clock generation circuitry 26 and clock adjustment circuitry 36 in FIG. 4A.

FIG. 4B shows a detailed block diagram of the clock generation circuitry in block 26 of FIG. 4A for one embodiment of the invention. A 80 MHz clock signal CLKIN on conductor 55 is generated by dividing the 160 MHz signal on conductor 29 in FIG. 4A by 2, and is connected to the input of a string of four inverters and a noninverting buffer collectively designated by reference 56 to produce the above mentioned signal CLK on conductor 27A and applies it as an input to image processor 33 of FIG. 4A. Conductor 55 also is connected to one input of an exclusive OR gate and to the input of the first of a string of four inverters the output of which is connected to the other input of the exclusive OR gate, the output of which is inverted by another inverter, all of which are collectively referred to by reference numeral 57 and constitute a pulse generator which generates pulses at the times of the rising edges and falling edges of the clock signal on conductor 55. A 160 MHz signal is produced on conductor 27B by the pulse-frequency-doubling circuitry 57.

Conductor 55 also is connected to the input of a string of two inverters, the output of which is connected to the clock input of a D-type flip-flop 58, which receives and latches the subsequently described synchronization signal SYNC. The output of D-type flip-flop 58 is connected to the input of flip-flop 59, an inverting output of which is connected to the input of D-type flip-flop 60. The output of flip-flop 60 is connected to the input of a D-type flip-flop 61. The clock inputs of flip-flops 59, 60 and 61, which operate to generate a reset signal, are connected to conductor 27B to receive the 160 MHz clock signal 2×CLK. The output of flip-flop 61 and the output of flip-flop 59 are connected to the inputs of an AND gate 62, the output of which is connected to the input of a clock counter circuit 65. Clock counter 65 is a conventional resettable counter that can be easily provided by one skilled the art. The clock input of counter 65 is connected to receive the 160 MHz signal on conductor 27B. The output of AND gate 62 functions as a synchronization signal for resettable clock counter 65.

Clock counter 65 is utilized in generation of all of the various control signals for timing of multiplexer circuit 42 and sample/hold circuit 43 in subsequently described FIG. 5A and provides the basis for the sample clock signals shown in subsequently described FIG. 5B. In particular, clock counter 65 provides all of the half-clock-cycle pulses required for performing the function of multiplex circuit 42 in subsequently described FIG. 5A. 8 NAND gates collectively designated by reference numeral 63 decode the outputs of clock counter 65 to generate half-cycle pulses CH1-4 and pulses CH5-8 that correspond to the pulses shown in the lower 4 waveforms shown in subsequently described FIG. 5B. The outputs of the 8 NAND gate 63 are connected to the D inputs of 8 flip-flops 64-1,2 . . . 8 which are clocked by the 2×CLK signal on conductor 27B. The 8 outputs of flip-flops 64-1,2 . . . 8, respectively, are connected to the inputs of decode and non-overlapping clock generation circuitry in block 69. A 10 MHz signal CK1 and a 80 MHz signal CK8 of clock counter 65 (corresponding to the pulses labeled "1" and "8" in the CLK waveform FIG. 5B) also are connected to inputs of decode and non-overlapping clock generation circuitry 69, which produces the signals CLKS-E, CLKS-O, OH1, OH2, EA, OA, and a number of non-overlapping variations of these signals. The clock signals OH1,2 . . . 8 occur at the times indicated by CH1,2 . . . 8, respectively, in the four lower waveforms shown in FIG. 5C. The clock signal EA is essentially a non-overlapping, in-phase replica of CLK as shown in FIG. 5B, and the clock signal OA is the complement of EA.

Figure 5A:
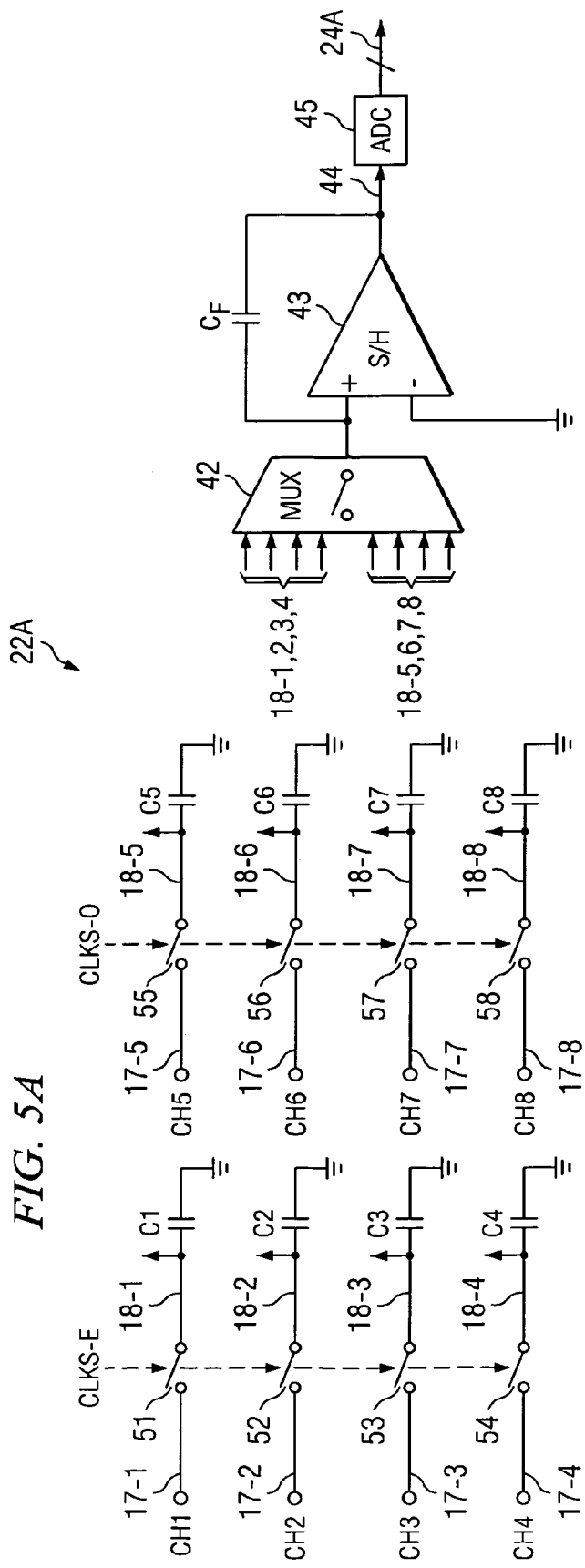
FIG. 5A is a schematic diagram of the circuitry in block 22A of FIG. 4A.
Figure 5B:
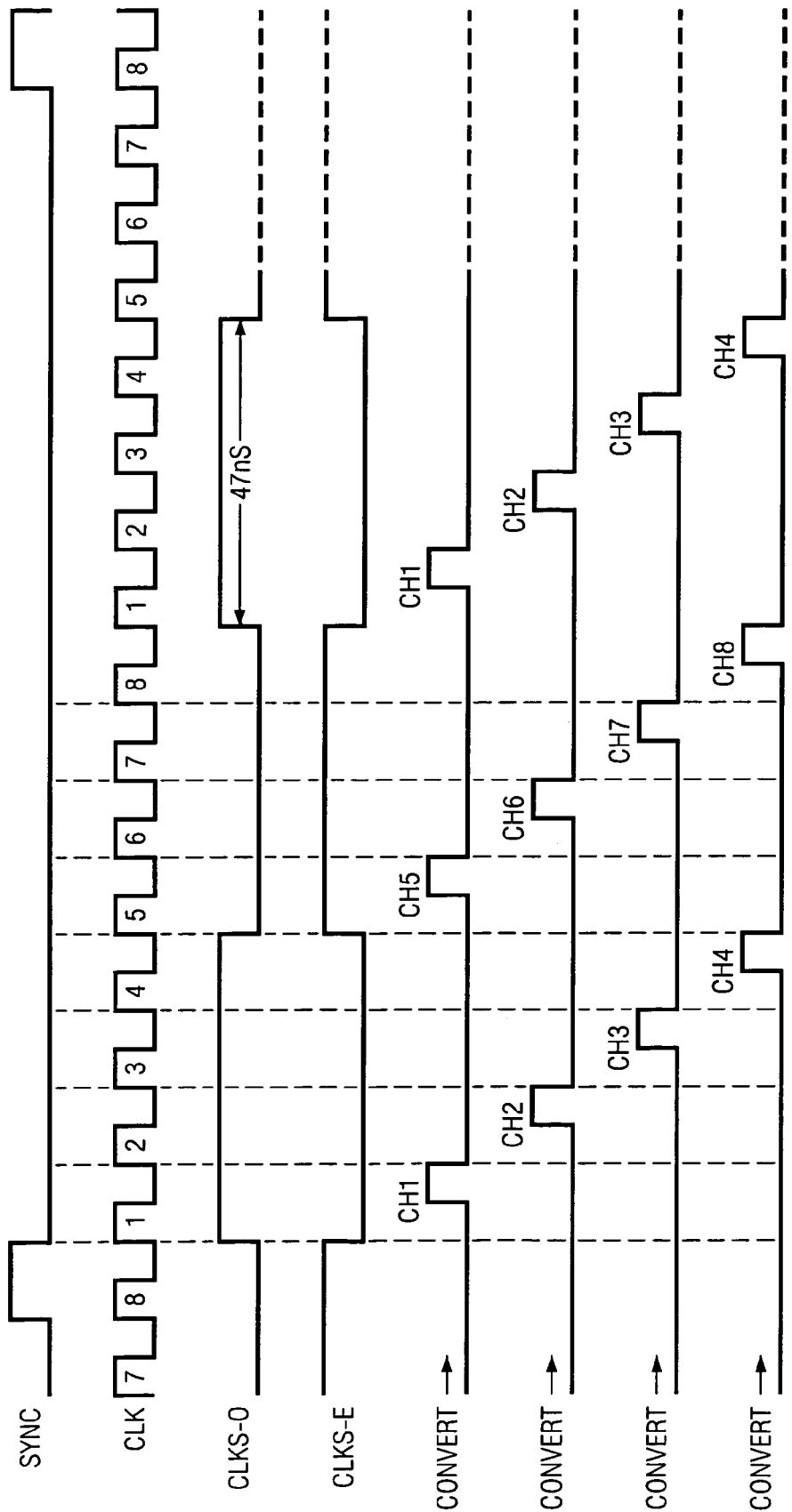
FIG. 5B is a timing diagram useful in explaining operation of the circuitry shown in FIG. 5A.
Figure 5C:
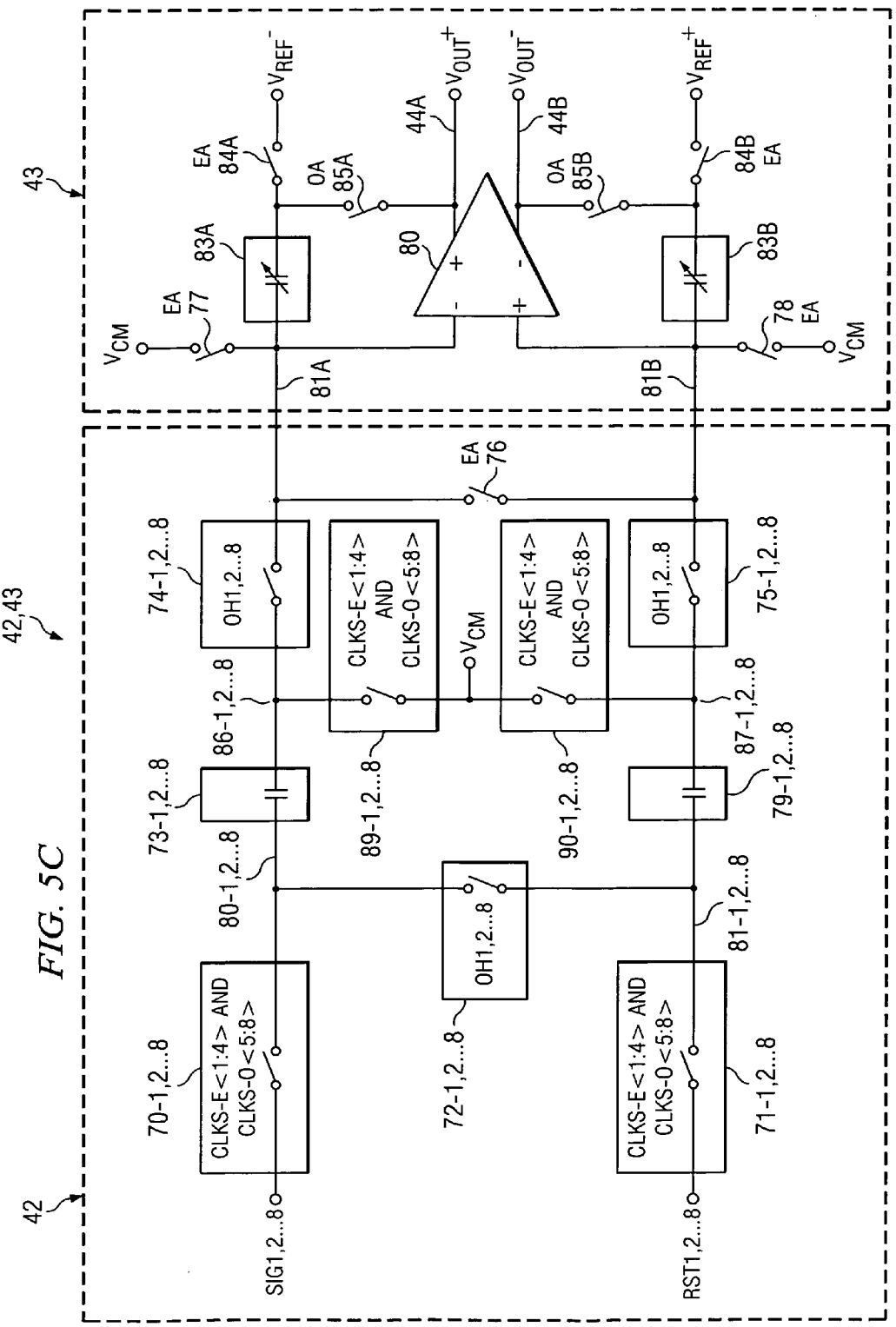
FIG. 5C is a schematic diagram of the multiplexor circuitry in block 42 and sample/hold circuit in block 43 in FIG. 5A.

There are 16 capacitors (i.e., sampling capacitors 73-1,2 . . . 8 and 79-1,2 . . . 8 in FIG. 5C) of sample/hold circuit 43, and 8 different clock phases are needed to assert when the voltage on each individual sampling capacitor needs to be applied to the input of sample/hold circuit 43 to generate the next output sample to be converted by ADC 45. The outputs CLK1 and the complement of CLK in FIG. 4B are used to generate a slow sampling clock signal which results in generation of the CLKS-E and CLKS-O in FIG. 5B.

The 10 MHz CMOS sensor clock signal ADJUSTABLE CIS CLOCK produced on conductor 37 of FIG. 4A controls the exact timing of the enabling or strobing of the CMOS sensors, so the timing of all of the CMOS sensor output signals, including when they will be asserted and when they settle, is controlled by ADJUSTABLE CIS CLOCK. In FIG. 2, the CMOS sensor output signal begins to settle at the time of the falling edge of ADJUSTABLE CIS CLOCK produced by CIS clock adjustment circuitry 36 of FIGS. 4A and 4B, and by the time the next falling edge occurs the CMOS sensor output signal has completely settled.

Phase locked loop circuit 28 in FIG. 4A generates a 160 MHz clock as an input to clock circuit 26, which divides the 160 MHz clock a factor of 2 to generate the two 80 MHz clock signals CLK and ADC CLOCK. There also is circuitry in clock circuit 26 that receives the synchronization signal SYNC on conductor 31, for the purpose of setting up the correct timing of the sample/hold and ADC circuits relative to ADJUSTABLE CIS CLOCK. The ADCs operate in a different clocking "domain" than the CMOS sensors and the ADJUSTABLE CIS clock signal. The timing of the sampling clocks, the sample/hold circuit clock signals and the ADC clock signal is maintained on the basis of SYNC. Although the image processor 33 "understands" the relationship of the master clock, the SYNC signal and the CIS clocks but has no "knowledge" of the clocks in the ADC circuits.

FIG. 5A shows details of blue light sensor sampling and ADC circuitry 22A of FIG. 4A. The configurations of red and green sensor sampling and ADC circuitry 22B and 22C are essentially the same as blue sampling and ADC circuit 22A. Blue light sensor sampling and ADC circuitry 22A includes 8 switches S1,2 . . . 8 having their left terminals connected to conductors 17-1,2 . . . 8, respectively, to receive the analog output signals CH1,2 . . . 8 produced by the blue light CMOS sensors (14A(1-8) in FIG. 6) in CMOS blue light sensor array 14A, respectively. The right terminals of switches S1,2 . . . 8 are connected to conductors 18-1,2 . . . 8, respectively. Each of conductors 18-1,2 . . . 8 is connected to an upper plate of a corresponding sampling capacitor C1,2 . . . 8, respectively, a lower plate of which is connected to ground. Each of switches S1,2,3,4 is included in one "bank" and is controlled by a clock signal CLKS-E, and each of switches S5,6,7,8 is included in another "bank" and is controlled by the clock signal CLKS-O.

Sampling capacitor conductors 18-1,2,3,4 are connected to a group of 4 corresponding inputs, respectively, of a multiplexer circuit 42, and similarly, sampling capacitor conductors 18-5,6,7,8 are connected to another group of 4 corresponding inputs, respectively, of multiplexer circuit 42. As subsequently explained in more detail with reference to FIG. 5C, multiplexer circuitry 42 sequentially couples the sampled CMOS sensor output signals on conductors 18-1,2 . . . 8 to the (+) input of a conventional sample/hold circuit 43, the (−) input of which is connected to ground. The output of sample/hold circuit 43 is coupled by conductor 44 to one terminal of a feedback capacitor $C_F$ the other terminal of which is coupled to the (+) input of sample/hold circuit 43. Output conductor 44 of sample/hold circuit 43 is also connected to the analog input of a 12-bit ADC 45, a digital output of which is connected to digital bus 24A.

FIG. 5B shows a timing diagram of the various clock signals mentioned above the 4 lower "CONVERT" waveforms indicate the times at which conversion control signals OH1,2 . . . 8 (not shown) are applied to ADC 45 to convert the sampled signals corresponding to CMOS sensor output voltage signals CH1-8 to digital values on digital bus 24A. The 45 nanosecond CLKS-O pulses are operative to close switches S5-8 to accomplish sampling of CMOS sensor output voltages CH5-8 while at the same time the CLKS-E are operative to open switches S1-4 to allow multiplexer 42 to couple the sampled voltages on sampling capacitors C1-4 and present them to the input of ADC 45 for conversion at the times indicated by the CH1, CH2, CH3 and CH4 pulses of the 4 lower "CONVERT" waveforms. Similarly, the 45 nanosecond CLKS-E pulses are operative to close switches S1-4 to accomplish sampling of CMOS sensor output voltages CH1-4 while at the same time the CLKS-O are operative to open switches S5-8 to allow multiplexer 42 to couple the sampled voltages on sampling capacitors C5-8 and present them to the input of ADC 45 for conversion at the times indicated by the CH5, CH6, CH7 and CH8 pulses of the 4 lower "CONVERT" waveforms.

Switches S1-4 are controlled by the signal CLKS-E, and switches S5-8 are clocked by CLKS-O. The 2 corresponding banks of CMOS sensors operate out-of-phase with respect to each other, which allows the capability of using only a single ADC with 8 CMOS sensor "channels", allows fast serial sampling of the 8 parallel CMOS sensor channels, and nevertheless allows more time for sampling each CMOS sensor. While channels CH1-4 are being converted, channels CH5-8 are connected to their corresponding bank of CMOS image sensors 5-8 and are being charged up i.e., are undergoing their charging, settling, and sampling. By setting up the two banks of CMOS sensors, the present invention allows longer CMOS sensor output signal sampling times.

Sample/hold circuit 43 produces an output coupled to the analog input of ADC converter 45. ADC 45 is clocked at 80 MHz, as is sample/hold circuit 43. The clocks CLKS-O and CLKS-E run at 10 MHz. There are 8 CLK cycles for every CLKS-O pulse and every CLKS-E pulse. That results in a 47 nanosecond time interval during which each bank of 4 CMOS sensors of one bank can be coupled to the input of sample/hold amplifier 43 and converted to a digital output by ADC 45. During that same 47 nanosecond time interval, 4 sampling capacitors of the other bank are connected to the output signals produced by the other bank of corresponding CMOS sensors.

FIG. 5C shows a differential implementation of sample/hold circuit 42,43 which schematically incorporates both multiplexer circuitry 42 and sample/hold circuit 43 of FIG. 5A, as indicated. The 8 SIG output signals and the 8 RST output signals produced by the 8 CMOS sensors 14A(1-8) as shown in FIG. 6 are provided as inputs to sample/hold circuit 42,43. Eight switches 70-1,2 . . . 8 have their left terminals connected to receive eight CMOS sensor output signals SIG1,2 . . . 8, respectively, and their right terminals connected to conductors 80-1,2 . . . 8, respectively. Similarly, eight switches 71-1,2 . . . 8 have their left terminals connected to receive eight sensor output "reset" signals RST1,2 . . . 8, respectively, and their right terminals connected to conductors 82-1,2 . . . 8, respectively. Switches 70-1,2,3,4 are controlled by CLKS-E, and switches 70-5,6,7,8 are controlled by CLKS-O of FIG. 5B. Similarly, switches 71-1,2,3,4 are controlled by CLKS-E, and switches 70-5,6,7,8 are controlled by CLKS-O. Eight switches 72-1,2 . . . 8 have upper conductors connected to conductors 80-1,2 . . . 8, respectively, and lower conductors connected to conductors 82-1,2 . . . 8, respectively. Switches 72-1,2 . . . 8 are controlled by signals OH1,2 . . . 8, respectively.

Conductors 80-1,2, . . . 8 also are connected to the left terminals of sampling capacitors 73-1,2 . . . 8, respectively. The right terminals of sampling capacitors 73-1,2 . . . 8 are connected by conductors 86-1,2 . . . 8 to left terminals of eight switches 74-1,2 . . . 8, respectively. Switches 74-1,2 . . . 8 are controlled by clock signals OH1,2 . . . 8, respectively. Similarly, conductors 82-1,2, . . . 8 also are connected to the left terminals of eight sampling capacitors 79-1,2 . . . 8, respectively. The right terminals of sampling capacitors 79-1,2 . . . 8 are connected by conductors 87-1,2 . . . 8 to left terminals of eight switches 75-1,2 . . . 8, respectively. Switches 75-1,2 . . . 8 are also controlled by clock signals OH1,2 . . . 8, respectively. Conductors 86-1,2 . . . 8 also are connected to the upper terminals of switches 89-1,2 . . . 8, the lower terminals of which are connected to the common mode voltage $V_{CM}$. Switches 89-1,2,3,4 are controlled by CLKS-E and switches 89-5,6,7,8 are controlled by CLKS-O, as indicated. Similarly, conductors 87-1,2 . . . 8 also are connected to the lower terminals of switches 90-1,2 . . . 8, the upper terminals of which are connected to the common mode voltage $V_{CM}$. Switches 90-1,2,3,4 are controlled by CLKS-E and switches 90-5,6,7,8 are controlled by CLKS-O, as indicated.

The right terminals of switches 74-1,2 . . . 8 are connected by conductor 81A to the (−) input of a sample/hold amplifier 80 of sample/hold circuit 43 and to the upper terminal of a reset switch 76. Similarly, the right terminals of switches 75-1,2 . . . 8 are connected by conductor 81B to the (+) input of operational amplifier 80 and to the lower terminal of reset switch 76. Reset switch 76 is controlled by the above mentioned reset signal EA. The (+) output of sample/hold amplifier 80 is connected to conductor 44A, which is connected to a corresponding input of ADC 45, and the (−) output of sample/hold amplifier is connected to another corresponding input of ADC 45.

Conductor 81A also is connected to one terminal of a precharge switch 77 having another terminal connected to a common mode reference voltage $V_{CM}$. Conductor 81A also is connected to one terminal of a programmable capacitor array 83A, the other terminal of which is coupled by switch 85A to output conductor 44A. Switch 85A is controlled by above mentioned signal OA, which is the complement of the signal EA. Similarly, conductor 81B also is connected to one terminal of a precharge switch 78 having another terminal connected to the common mode reference voltage $V_{CM}$. Conductor 81B also is connected to one terminal of another programmable capacitor array 83B, the other terminal of which is coupled by switch 85B to output conductor 44B. Switch 85B is controlled by the signal OA. One terminal of a precharge switch 84A is connected to conductor 44A, the other terminal of which is connected to a negative full scale reference voltage VREF−, and one terminal of a precharge switch 84B is connected to conductor 44B, the other terminal of which is connected to a positive full-scale reference voltage VREF+.

Sampling of groups of 4 CMOS sensors is achieved by asserting either CLKS-O or CLKS-E, as previously described. The eight signals OH1,2 . . . 8 control switches 72-1,2 . . . 8, respectively. In the timing diagram of FIG. 5B, the 4 bottom "CONVERT" waveforms indicate the times at which the sampled CMOS sensor output signals are applied to the inputs of sample/hold amplifier 43 and hence to the analog inputs of ADC 45, which occurs as result of the operation of the 8 NAND gates 63 previously described in FIG. 4B.

FIG. 6 shows a more generalized block diagram of an image sensing system 10 including the multi-input CIS image processor integrated circuit 20 of FIGS. 3 and 4A-C. FIG. 6 illustrates the use of both CMOS sensors 1-4 in each of sensor arrays 14A,B,C which respond to a falling edge of ADJUSTABLE CIS CLOCK and CMOS sensors 5-8 which respond to a rising edge of ADJUSTABLE CIS CLOCK. CMOS sensors 5-8 in each of "blue", "red", and "green" CMOS sensor arrays 14A, 14B and 14C respond to a rising edge of ADJUSTABLE CIS CLOCK and in each case CMOS sensors 1-4 respond to a falling edge of ADJUSTABLE CIS CLOCK. To this end, CMOS sensors 1-4 have an inverting input connected to receive ADJUSTABLE CIS CLOCK on conductor 37, whereas in each case CMOS sensors 5-8 have a non-inverting input connected to receive ADJUSTABLE CIS CLOCK on conductor 37. The CMOS sensors of a particular group, e.g. blue light CMOS sensors, are arranged in banks which are alternately strobed or enabled so that the analog output signals of one bank are rapidly and sequentially coupled to the input of a single ADC while the CMOS sensors of the other bank are accumulating photons and accumulating corresponding charge. This arrangement provides the advantages described above, of achieving both reduced cost for ADCs and suitably high image processing speed.

In FIG. 6, three ADC converters 45-1,2,3 and the PLL reference circuitry PLL/REF are included along with the image processor 33 in the multi-input image processor 20. In this case, the one CIS clock signal CIS ADJUSTABLE CLOCK goes to each of the CMOS sensors 1-4 and also to the CMOS sensors 5-8 in each CMOS image sensor sub-array. In another embodiment, a first CIS clock signal CIS ADJUSTABLE CLOCK1 goes to each of the CMOS sensors 1-4 and a second CIS clock signal ADJUSTABLE CIS CLOCK2 goes to each of the CMOS sensors 5-8 in each CMOS image sensor sub-array wherein ADJUSTABLE CIS CLOCK2 is the logical complement of CIS ADJUSTABLE CLOCK1. In this case, the complementary or inverting input "bubble" symbols are omitted, and the two adjustable CIS clocks are out of phase with each other.

Figure 7:
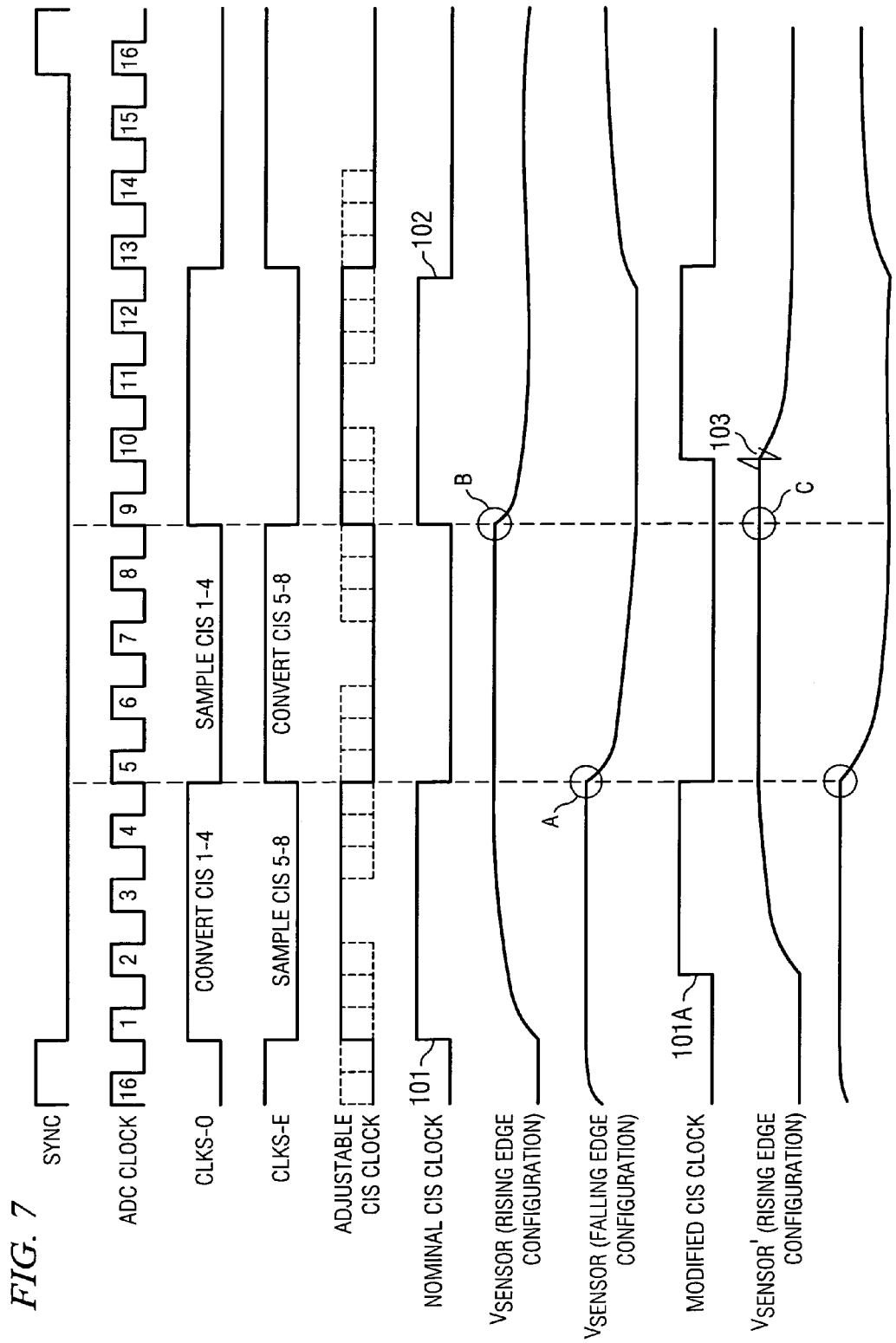
FIG. 7 is a timing diagram useful for describing the operation of the multi-input CIS image processor integrated circuit of FIG. 4A.

FIG. 7 shows a timing diagram to aid in explaining the operation of the system 10 as illustrated in FIGS. 3, 4A, 5A, and 6. The dotted lines in the ADJUSTABLE CIS CLOCK waveform indicate, for example, 6-nanosecond intervals by which the rising edges and falling edges can be adjusted, in accordance with the contents of corresponding edge phase registers 66A and 66B in FIG. 4A. The operations of converting the previously sampled voltages CH1-4 and sampling of the present voltages CH5-8 occur during the signal CLKS-O, and the operations of converting the previously sampled voltages CH5-8 and sampling of the present voltages CH1-4 occur during its logical complement signal CLKS-E as indicated by the various waveforms. The waveform NOMINAL CIS CLOCK illustrates the configuration of the signal ADJUSTABLE CIS CLOCK if its rising edges and falling edges are perfectly synchronized with the rising and falling edges of CLKS-O, respectively. If that is the case, then the MOS sensors which are responsive to a falling edge of ADJUSTABLE CIS CLOCK are enabled or strobed at the same time as the falling edge of pulse 101 of the NOMINAL CIS CLOCK waveform, as indicated by "A". Similarly, the MOS sensors which are responsive to a rising edge of ADJUSTABLE CIS CLOCK are enabled or strobed at the same time has the rising edge of pulse 100 and to of the NOMINAL CIS CLOCK waveform, as indicated by "B".

However, if the rising edges of ADJUSTABLE CIS CLOCK are delayed by two 6-nanosecond intervals, i.e., by 12 nanoseconds, as indicated by the rising edge of pulse 102 of the waveform MODIFIED CIS CLOCK, then the MOS sensors which are responsive to a rising edge of ADJUSTABLE CIS CLOCK are enabled or strobed at a time which is later than the sampling time, an example of which is indicated by "C" of the $V_{SENSOR}'$ waveform. The 6-nanosecond intervals are digitally derived, for example from CLK on conductor 27A in FIG. 4A. Reference numeral 103 designates noise which may be superimposed on the output of that CMOS sensor as a result of circuit switching associated with the rising edges of ADJUSTABLE CIS CLOCK.

By sampling the output of the CMOS sensor at the time of "C" before the noise 103 occurs, analog to digital conversion errors that might otherwise be caused by the noise 103 are avoided.

FIG. 8 shows a timing diagram similar to the one in FIG. 7, and is useful in describing the operation a version of the multi-input CIS image processor integrated circuit of FIGS. 3, 4, 5A, and 6 that has been modified to use only CMOS sensors that are enabled or strobed in response to one direction of edge pulse, either rising or falling but not both. In this case, two adjustable CIS clock signals ADJUSTABLE CIS CLOCK1 and ADJUSTABLE CIS CLOCK2 are provided, one being the logical complement of the other if their edge phase settings are the same, or approximately the logical complement of the other if there edge phase settings are different. The waveforms shown in FIG. 8, the basic operation of clock generator circuitry 26, and the operation of CIS clock adjustment circuitry 36 are essentially the same as previously described. The technique indicated in FIG. 8 requires providing an additional pin to the integrated circuit package containing the multi-input CIS image processor 20, which allows some simplification of the configuration of the CMOS sensors.

The manufacturer or user of multi-input CIS image processor 20 makes the determinations of when and how much to adjust rising edges and falling edges of ADJUSTABLE CIS CLOCK during calibration of the system and simply writes corresponding information into the edge phase registers 66A and 66B. Those skilled in the art can readily provide adjustable finite state machine 67 to accomplish the desired number of 6 nanosecond (for example) increments to the edges of ADJUSTABLE CIS CLOCK in response to the calibration information in edge phase registers 66A and 66B. The adjustable FSM provides an adjustment of the phases of the rising edges and falling edges of single clock with adjustable coarse duty cycles (e.g., 50-50, 7/16-9/16, etc) and also provides an additional option to delay ADJUSTABLE CIS CLOCK relative to the fixed phase signal ADC CLOCK and SYNC signals. In the two-clock configuration of FIG. 8, two phase registers would be needed, but it might be desirable to have 4 registers for each clock in this case to control both rising and falling edges as this might allow timing of both edges of both clocks to be adjusted, thereby allowing for fine tuning of when digital noise on the printed circuit board occurs relative to the edge of the clock that is not relevant to strobing of the CMOS sensor.

The resulting independent adjustment of the phases of the edges of the CIS clock signal (or signals) allows convenient adjustments so to optimize the timing of the strobing of the same-color CMOS sensor banks (i.e., CMOS sensors 1-4 and 5-8) and so as to optimize the CMOS sensor sampling for individual colors.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the basic idea of multiple banks of CMOS sensors that are enabled or strobed in out-of-phase relationship with each other could be expanded to use a total of six independently controlled/adjusted CIS clocks for each bank of CMOS sensors. Of course, various implementations of the specific circuitry described herein, such as the sample/hold circuitry, switching circuitry, etc. can be readily provided by those skilled in the art.

What is claimed is:

1. A CMOS image sensor system comprising:
   (a) a first group of CMOS sensors each responsive to a periodic first clock signal edge to present an output signal representative of sampled light intensity;
   (b) a second group of CMOS sensors each responsive to a periodic second clock signal edge to present an output signal representative of sampled light intensity, the second clock signal edge being out-of-phase with respect to the first clock signal edge;
   (c) a first group of sampling switches for coupling output terminals of the first group of CMOS sensors to a first group of sampling capacitors, respectively;
   (d) a second group of sampling switches for coupling output terminals of the second group of CMOS sensors to a second group of sampling capacitors, respectively;
   (e) a sample/hold circuit having an output coupled to an input of an ADC (analog-to-digital converter); and
   (f) a switching circuit including an output coupled to an input of the sample/hold circuit, and also including a first group of inputs coupled to the sampling switches of the first group, respectively, and a second group of inputs coupled to the sampling switches of the second group, respectively, the switching circuit sequentially coupling sampled signals on the first group of sampling capacitors to the input of the sample/hold circuit between the first and second clock signal edges and sequentially coupling sampled signals on the second group of sampling capacitors to the input of the sample/hold circuit after the second clock signal edge.

2. The CMOS image sensor system of claim 1 wherein the first clock signal edge is a rising edge of a first clock signal and the second clock signal edge is a falling edge of the first clock signal.

3. The CMOS image sensor system of claim 2 wherein a phase of the rising edge of the first clock signal is adjustable relative to an ADC clock signal independently of a phase of the falling edge of the first clock signal, and wherein the phase of the falling edge of the first clock signal is adjustable relative to the ADC clock signal independently of the phase of the rising edge of the first clock signal.

4. The CMOS image sensor system of claim 1 wherein the first clock signal edge is a rising edge of a first clock signal and the second clock signal edge is a rising edge of a second clock signal.

5. The CMOS image sensor system of claim 4 wherein the second clock signal is approximately a logical complement of the first clock signal.

6. The CMOS image sensor system of claim 1 wherein the CMOS sensors of the first and second groups are primarily sensitive to a first color of light.

7. The CMOS image sensor system of claim 6 wherein elements (a) through (f) are included in a first channel, the CMOS image sensor system also including a second channel that is essentially similar to the first channel except that CMOS sensors included in the second channel are primarily sensitive to a second color of light.

8. The CMOS image sensor system of claim 1 including clock adjustment circuitry which includes a first register for storing rising edge adjustment information, and which also includes a finite state machine coupled to the first register and operative to adjust a phase of the first clock signal edge, relative to a signal which clocks the ADC, in accordance with the rising edge adjustment information.

9. The CMOS image sensor system of claim 8 wherein the clock adjustment circuitry includes a second register coupled to the finite state machine for storing falling edge adjustment information, wherein the finite state machine is operative to adjust a phase of the second clock signal edge, relative to the signal which clocks the ADC, in accordance with the falling edge adjustment information.

10. The CMOS image sensor system of claim 9 wherein at least one of the rising edge adjustment information and the falling edge adjustment information includes calibration information which causes the first clock edge signal or the second clock edge signal to be shifted relative to the signal which clocks the ADC so as to prevent circuit noise from being superimposed on sampled signals being converted by the ADC.

11. The CMOS image sensor system of claim 9 including clock generation circuitry which applies complementary first and second sampling signals to control terminals of the first and second groups of switches, respectively.

12. The CMOS image sensor system of claim 11 wherein the clock generation circuitry includes circuitry which generates a first and second sample clock signals for controlling the first and second groups of sample switches, respectively, in synchronization with a synchronization signal and the ADC clock signal, wherein the phases of at least one of the first and second clock signal edges is adjusted by a time increment digitally derived from a clock signal associated with the ADC clock signal.

13. The CMOS image sensor system of claim 12 wherein the clock generator circuitry includes a resettable clock counter circuit and a plurality of ANDing gates which control timing of the sequential coupling of the sampled signals on the first group of sampling capacitors to the input of the sample/hold circuit between the first and second clock signal edges and the coupling of the sampled signals on the second group of sampling capacitors to the input of the sample/hold circuit after the second clock signal edge.

14. A method of operating a CMOS image sensor system that includes a first group of CMOS sensors each responsive to a periodic first clock signal edge to present an output signal representative of sampled light intensity, the method including:
   (a) providing a second group of CMOS sensors each responsive to a periodic second clock signal edge to present an output signal representative of sampled light intensity, the second clock signal edge being out-of-phase with respect to the first clock signal edge;

(b) coupling output terminals of the first group of CMOS sensors to a first group of sampling capacitors, respectively, by means of a first group of sampling switches;

(c) after step (b), coupling output terminals of the second group of CMOS sensors to a second group of sampling capacitors, respectively, by means of a second group of sampling switches;

(d) sequentially coupling previously sampled signals on the second group of sampling capacitors to an input of an ADC during step (b); and (e) sequentially coupling previously sampled signals on the first group of sampling capacitors to the input of the ADC during step (c).

15. The method of claim 14 wherein step (b) includes de-coupling the output terminals of the second group of CMOS sensors from the second group of sampling capacitors while coupling the output terminals of the first group of CMOS sensors to the first group of sampling capacitors, and wherein step (c) includes de-coupling the output terminals of the first group of CMOS sensors from the first group of sampling capacitors while coupling the output terminals of the second group of CMOS sensors to the second group of sampling capacitors.

16. The method of claim 14 wherein the first clock signal edge is a rising edge of a first clock signal and the second clock signal edge is a falling edge of the first clock signal.

17. The method of claim 14 wherein the first clock signal edge is a rising edge of a first clock signal and the second clock signal edge is a rising edge of a second clock signal.

18. The method of claim 14 including adjusting a phase of at least one of the first and second clock signal edges, relative to a signal which clocks the ADC, in accordance with stored calibration information so as to avoid circuit noise from being superimposed on sampled signals coupled to the input of the ADC.

19. A CMOS image sensor system comprising
(a) a first group of CMOS sensors each responsive to a periodic first clock signal edge to present an output signal representative of sampled light intensity, the system including:
(b) a second group of CMOS sensors each responsive to a periodic second clock signal edge to present an output signal representative of sampled light intensity;
(c) means for producing the second clock signal edge in out-of-phase relationship with respect to the first clock signal edge;
(d) means for coupling output terminals of the first group of CMOS sensors to a first group of sampling capacitors, respectively;
(e) means for coupling output terminals of the second group of CMOS sensors to a second group of sampling capacitors, respectively, after the coupling of element (d);
(f) means for sequentially coupling previously sampled signals on the second group of sampling capacitors to an input of an ADC during the coupling of element (d); and
(g) means for sequentially coupling previously sampled signals on the first group of sampling capacitors to the input of the ADC during the coupling of element (e).

20. The CMOS image sensor system of claim 19 including means for adjusting a phase of at least one of the first and second clock signal edges, relative to a signal which clocks the ADC, in accordance with stored calibration information so as to avoid circuit noise from being superimposed on sampled signals coupled to the input of the ADC.

* * * * *